United States Patent
Nishi

(10) Patent No.: US 8,524,619 B2
(45) Date of Patent: Sep. 3, 2013

(54) METHOD FOR FABRICATING SEMICONDUCTOR DEVICE INCLUDING PERFORMING OXYGEN PLASMA TREATMENT

(75) Inventor: Masahiro Nishi, Kanagawa (JP)

(73) Assignee: Sumitomo Electric Device Innovations, Inc., Yokohama-shi, Kanagawa (JP)

( * ) Notice: Subject to any disclaimer, the term of this patent is extended or adjusted under 35 U.S.C. 154(b) by 0 days.

(21) Appl. No.: 13/193,034

(22) Filed: Jul. 28, 2011

(65) Prior Publication Data
US 2012/0028475 A1  Feb. 2, 2012

(30) Foreign Application Priority Data
Jul. 30, 2010  (JP) ................. 2010-171700

(51) Int. Cl.
*H01L 21/318* (2006.01)
*C23C 8/02* (2006.01)
*H01L 21/8252* (2006.01)

(52) U.S. Cl.
CPC ................................ *C23C 8/02* (2013.01)
USPC .... 438/791; 438/768; 257/649; 257/E21.141; 257/E21.143

(58) Field of Classification Search
CPC ........................................................ C23C 8/02
USPC .................. 438/585–586, 597, 607, 768, 38, 438/791; 257/E21.143, E23.132, E21.56, 257/640, 649, E21.293, E21.141
See application file for complete search history.

(56) References Cited

U.S. PATENT DOCUMENTS

| | | | | |
|---|---|---|---|---|
| 5,963,826 A * | 10/1999 | Takanabe et al. | ............. | 438/622 |
| 6,316,820 B1 * | 11/2001 | Schmitz et al. | ............... | 257/649 |
| 6,329,716 B1 * | 12/2001 | Nido et al. | ..................... | 257/745 |
| 6,423,562 B1 * | 7/2002 | Nido et al. | ..................... | 438/48 |
| 7,214,325 B2 * | 5/2007 | Lee et al. | ......................... | 216/13 |
| 7,585,779 B2 * | 9/2009 | Nishi | ............................ | 438/724 |
| 7,838,347 B2 * | 11/2010 | Suzawa et al. | ................ | 438/151 |
| 8,163,576 B2 * | 4/2012 | Shiozawa et al. | .............. | 438/22 |
| 8,164,115 B2 * | 4/2012 | Hikita et al. | .................. | 257/192 |
| 2001/0054763 A1* | 12/2001 | Nido et al. | ..................... | 257/745 |
| 2002/0020856 A1* | 2/2002 | Nido et al. | ..................... | 257/200 |
| 2002/0098658 A1* | 7/2002 | Kolodzey et al. | ............. | 438/285 |
| 2005/0221628 A1 | 10/2005 | Tanaka et al. | | |
| 2006/0172082 A1* | 8/2006 | Masuda | ........................ | 427/532 |
| 2006/0223326 A1* | 10/2006 | Nishi | ............................ | 438/706 |
| 2007/0170503 A1* | 7/2007 | Allibert et al. | ................ | 257/347 |
| 2007/0228415 A1* | 10/2007 | Kanamura et al. | ............ | 257/192 |
| 2007/0269968 A1* | 11/2007 | Saxler et al. | .................. | 438/522 |
| 2008/0121895 A1* | 5/2008 | Sheppard et al. | ............... | 257/76 |

(Continued)

FOREIGN PATENT DOCUMENTS

JP  2005-286135 A  10/2005

OTHER PUBLICATIONS

Kim et al., Low-Resistance Nonalloyed Ti/Al Ohmic Contacts on N-Face n-Type GaN via an O2 Plasma Treatment, IEEE, vol. 32, No. 2, Feb. 2011.*

*Primary Examiner* — Matthew Landau
*Assistant Examiner* — Maliheh Malek
(74) *Attorney, Agent, or Firm* — Westerman, Hattori, Daniels & Adrian, LLP

(57) ABSTRACT

A method for fabricating a semiconductor device including performing oxygen plasma treatment to a surface of a nitride semiconductor layer, a power density of the oxygen plasma treatment being 0.2 to 0.3 W/cm$^2$.

13 Claims, 4 Drawing Sheets

(56) References Cited

U.S. PATENT DOCUMENTS

| | | | |
|---|---|---|---|
| 2008/0290371 A1* | 11/2008 | Sheppard et al. | 257/192 |
| 2008/0305631 A1* | 12/2008 | Hirao | 438/680 |
| 2009/0140262 A1* | 6/2009 | Ohki et al. | 257/76 |
| 2009/0194507 A1* | 8/2009 | Cernak | 216/67 |
| 2009/0194796 A1* | 8/2009 | Hashimoto et al. | 257/263 |
| 2010/0019277 A1* | 1/2010 | Hata et al. | 257/190 |
| 2010/0068855 A1* | 3/2010 | Saxler et al. | 438/172 |
| 2010/0148322 A1* | 6/2010 | Allibert et al. | 257/632 |
| 2010/0317164 A1* | 12/2010 | Komatani | 438/172 |
| 2010/0320505 A1* | 12/2010 | Okamoto et al. | 257/192 |
| 2011/0073251 A1* | 3/2011 | Vontell et al. | 156/272.6 |
| 2011/0117726 A1* | 5/2011 | Pinnington et al. | 438/458 |
| 2011/0136305 A1* | 6/2011 | Saxler et al. | 438/172 |
| 2011/0142089 A1* | 6/2011 | Kudo | 372/46.012 |
| 2011/0147704 A1* | 6/2011 | Jiang et al. | 257/13 |
| 2011/0186859 A1* | 8/2011 | Ohki | 257/76 |
| 2011/0204381 A1* | 8/2011 | Okada et al. | 257/76 |
| 2011/0207256 A1* | 8/2011 | Su | 438/46 |
| 2011/0220895 A1* | 9/2011 | Hirai et al. | 257/57 |
| 2011/0227037 A1* | 9/2011 | Su | 257/13 |
| 2012/0021597 A1* | 1/2012 | Araya et al. | 438/606 |
| 2012/0028423 A1* | 2/2012 | Araya et al. | 438/191 |
| 2012/0049244 A1* | 3/2012 | Imada et al. | 257/194 |
| 2012/0052679 A1* | 3/2012 | Hou et al. | 438/660 |
| 2012/0074426 A1* | 3/2012 | Ohki et al. | 257/76 |
| 2012/0098599 A1* | 4/2012 | Chang et al. | 330/277 |
| 2012/0156836 A1* | 6/2012 | Shealy et al. | 438/172 |

* cited by examiner

METHOD FOR FABRICATING SEMICONDUCTOR DEVICE INCLUDING PERFORMING OXYGEN PLASMA TREATMENT

CROSS-REFERENCE TO RELATED APPLICATION

This application is based upon and claims the benefit of priority of the prior Japanese Patent Application No. 2010-171700, filed on Jul. 30, 2010, the entire contents of which are incorporated herein by reference.

BACKGROUND (i) Technical Field

The present invention relates to a method for fabricating a semiconductor device.

(ii) Related Art

There is a case where a semiconductor device such as a FET (Field Effect Transistor) using nitride semiconductor is used as an output amplifier for high frequency. Japanese Patent Application Publication No. 2005-286135 (hereinafter referred to as Document 1) discloses an invention of forming a SiN (silicon nitride) layer on a nitride semiconductor layer. Hydrogen content is adjusted in the SiN layer.

SUMMARY

In the art of Document 1, there is a problem that reliability of a semiconductor device may be degraded because of intrusion of water into the semiconductor device. It is an object of the present invention to provide a method for fabricating a semiconductor device that improves reliability.

According to an aspect of the present invention, there is provided a method for fabricating a semiconductor device including performing oxygen plasma treatment to a surface of a nitride semiconductor layer, a power density of the oxygen plasma treatment being 0.2 to 0.3 W/cm$^2$.

DETAILED DESCRIPTION

A description will be given of a cause for degrading reliability of a semiconductor device. A FET has a structure in which a source electrode, a drain electrode and a gate electrode are formed on a channel layer made of nitride semiconductor such as i-GaN (gallium nitride). The electrodes are made of metal such as Au.

When water gets into the semiconductor device, Au included in the electrode may dissolve in the water and may be ionized. In this case, when voltage is applied between the electrodes, ion migration phenomenon may occur. In the ion migration phenomenon, Au ion from one electrode moves to the other electrode and deposits on the other electrode by reduction. And so, an acceleration test was conducted in order to examine the ion migration phenomenon. In the acceleration test, a semiconductor device under a pinch off condition that drain voltage is 50 V and gate voltage is −3 V to −5 V was placed in an atmosphere having humidity of 85% at temperature of 130 degrees C. As a result, Au dissolved from the drain electrode deposits on the source electrode and the gate electrode. When the ion migration phenomenon occurs, the semiconductor device may be broken. That is, reliability of the semiconductor device may be degraded. Specifically, the ion migration has large influence on a semiconductor device including nitride semiconductor because the semiconductor device including nitride semiconductor is subjected to high voltage in an operation. Such ion migration may also occur by Al (aluminum), Ni (nickel), and W (tungsten) in the electrode.

There is a case where a water impervious protective layer is used in order to suppress the intrusion of water. However, in this case, it is necessary to adjust quality, thickness, and adhesiveness with an electrode of the protective layer. Therefore, the structure and the fabrication process of the semiconductor device may be complicated. When there is a variety in the quality of the protective layer, there is a variety in humidity resistance in many semiconductor devices.

The present inventors have found that the humidity resistance of a semiconductor device is improved significantly when a leak current smaller than a drain current flowing in an operation of the semiconductor device flows between a source electrode and a drain electrode or between a source electrode and a gate electrode.

A description will be given of a best mode for carrying the present invention.

[Embodiment]

An embodiment is a case where oxygen plasma treatment is performed. FIG. 1A through FIG. 3B illustrate a cross sectional view of a semiconductor device in accordance with the embodiment. FIG. 1A through FIG. 3B illustrate a schematic view. Each layer is schematically illustrated.

Figure 1A:
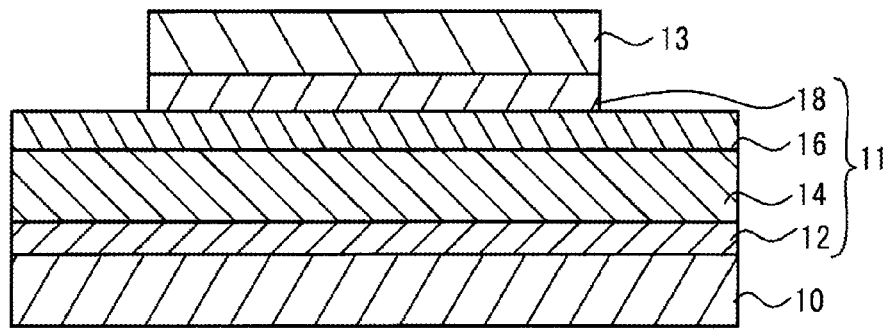
FIG. 1A through FIG. 1C are a cross sectional view for illustrating a method for fabricating a semiconductor device in accordance with an embodiment.

As illustrated in FIG. 1A, a semiconductor substrate in which a substrate 10, a barrier layer 12, a channel layer 14, an electron supply layer 16, and a cap layer 18 are laminated in this order from lower side is prepared. The substrate 10 is, for example, made of SiC (silicon carbide). The barrier layer 12 is, for example, made of AlN (aluminum nitride) having a thickness of 300 nm. The channel layer 14 is, for example, made of i-GaN (gallium nitride) having a thickness of 1000 nm. The electron supply layer 16 is, for example, made of AlGaN (aluminum gallium nitride) having a thickness of 20 nm. The cap layer 18 is, for example, made of n-GaN having a thickness of 5 nm. The barrier layer 12, the channel layer 14, the electron supply layer 16 and the cap layer 18 act as a nitride semiconductor layer 11. The nitride semiconductor layer 11 is epitaxially formed with an MOCVD (Metal Organic Chemical Vapor Deposition) method or the like. The nitride semiconductor layer 11 may not have the cap layer 18, and may be made of the barrier layer 12, the channel layer 14 and the electron supply layer 16.

A resist 13 is formed on a part of the cap layer 18. After that, the cap layer 18 is subjected to an etching. With the etching process, an exposed part of the cap layer 18 is removed, and a recess portion 28 is formed. The recess portion 28 exposes a part of the electron supply layer 16.

Figure 1B:
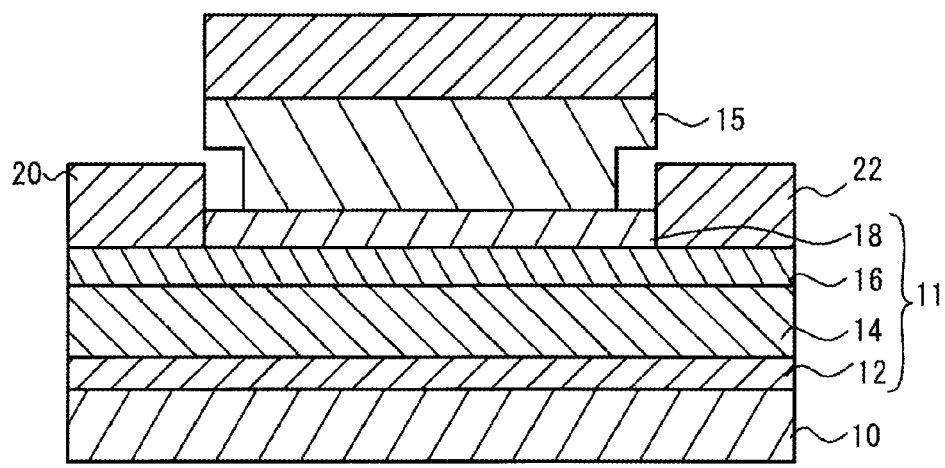

As illustrated in FIG. 1B, a source electrode 20 and a drain electrode 22 are formed in the recess portion with a vapor deposition method and a lift off method. In details, a resist 15 is formed, and a metal is deposited on the resist 15 and on an area without the resist 15. After that, the resist 15 with the deposited metal is removed. The source electrode 20 and the drain electrode 22 are an ohmic electrode in which Ti and Au are laminated in this order from the electron supply layer 16, or Ta and Al are laminated in this order from the electron supply layer 16. The source electrode 20 and the drain electrode 22 are subjected to a thermal treatment in order to make a favorable ohmic electrode.

Figure 1C:
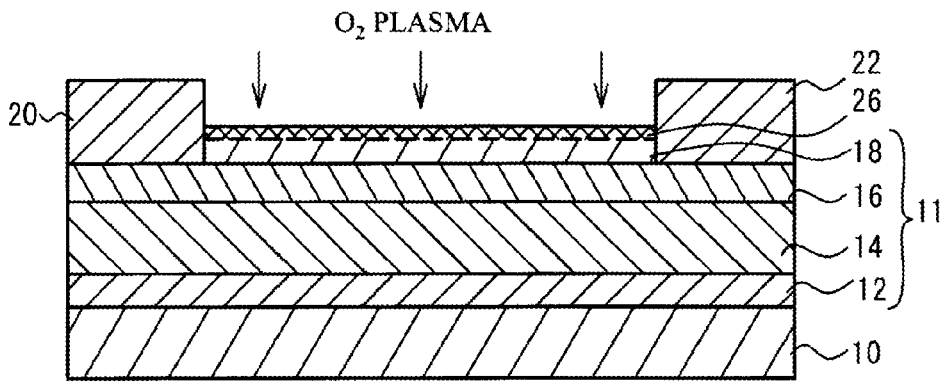

As illustrated in FIG. 1C, an upper face of the cap layer 18 is subjected to an oxygen plasma treatment with an usher. A condition of the oxygen plasma treatment is as follows. Power density is power per a unit area of an electrode of the usher.
Electrode area of the usher: 4000 cm²
Power of plasma: 800 W (corresponding to power density of 0.2 W/cm²)
RF frequency: 13.56 MHz
Treating time: 1 minute With the oxygen plasma treatment, N (nitrogen) included in the cap layer 18 is connected with O (oxygen) and is removed. Thus, a composition ratio of Ga (gallium) gets larger in an area of the cap layer 18 subjected to the oxygen plasma treatment than in another area of the cap layer 18 not subjected to the oxygen plasma treatment. Thus, a conductive layer 26 is formed on an upper face of the cap layer 18.

Figure 2A:
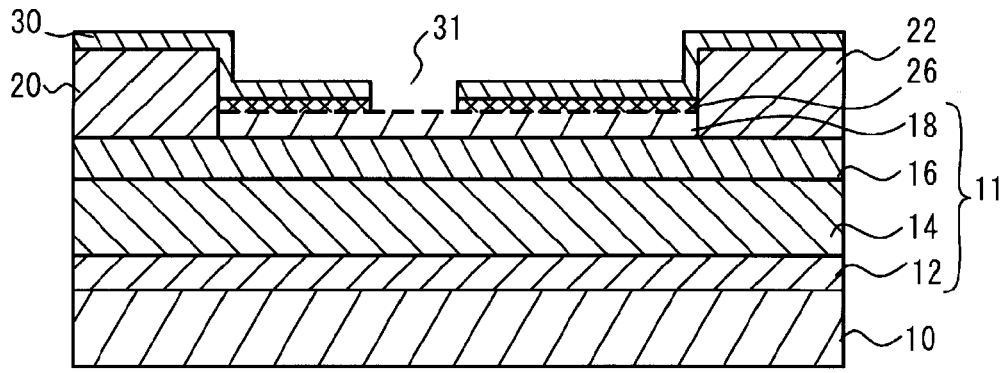
FIG. 2A through FIG. 2C are a cross sectional view for illustrating the method for fabricating the semiconductor device in accordance with the embodiment.

As illustrated in FIG. 2A, a SiN (silicon nitride) layer 30 is formed on the cap layer 18, the source electrode 20 and the drain electrode 22. The thickness of the SiN layer 30 is, for example, 20 nm. The SiN layer 30 is subjected to an etching treatment. Thus, an opening 31 is formed in a part of the SiN layer 30 between the source electrode 20 and the drain electrode 22. A part of the cap layer 18 is exposed through the opening 31. In this case, the conductive layer 26 in the opening 31 is etched.

Figure 2B:
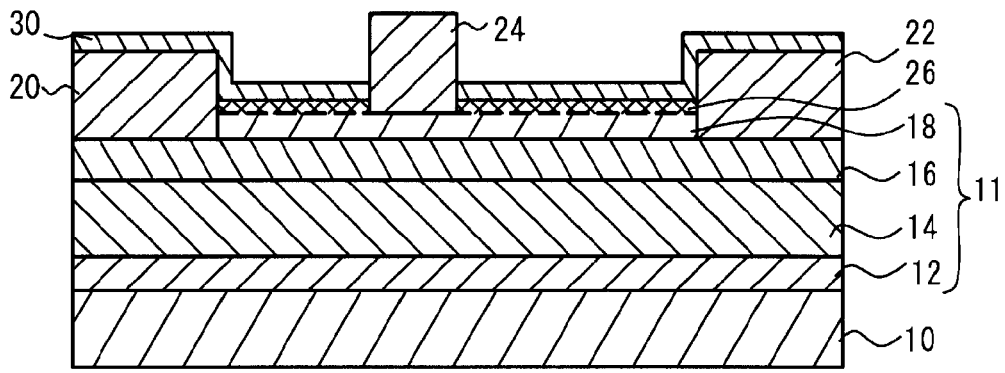
Figure 2C:
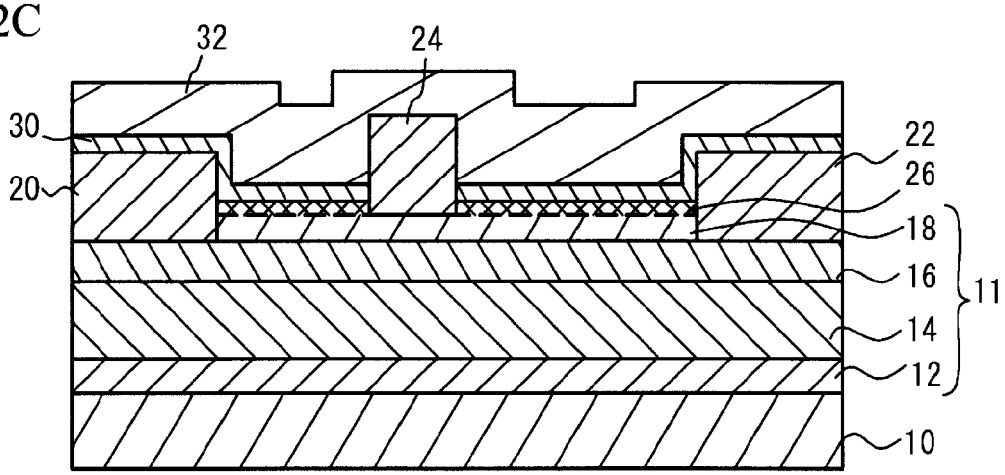

As illustrated in FIG. 2B, a gate electrode 24 is formed on an exposed area of the cap layer 18 with a vapor deposition method and a lift off method. The gate electrode 24 has a structure in which Ni and Au are laminated in this order from the cap layer 18. As illustrated in FIG. 2C, a SiN layer 32 is formed on the gate electrode 24 and the SiN layer 30. The thickness of the SiN layer 32 is, for example, 40 nm.

Figure 3A:
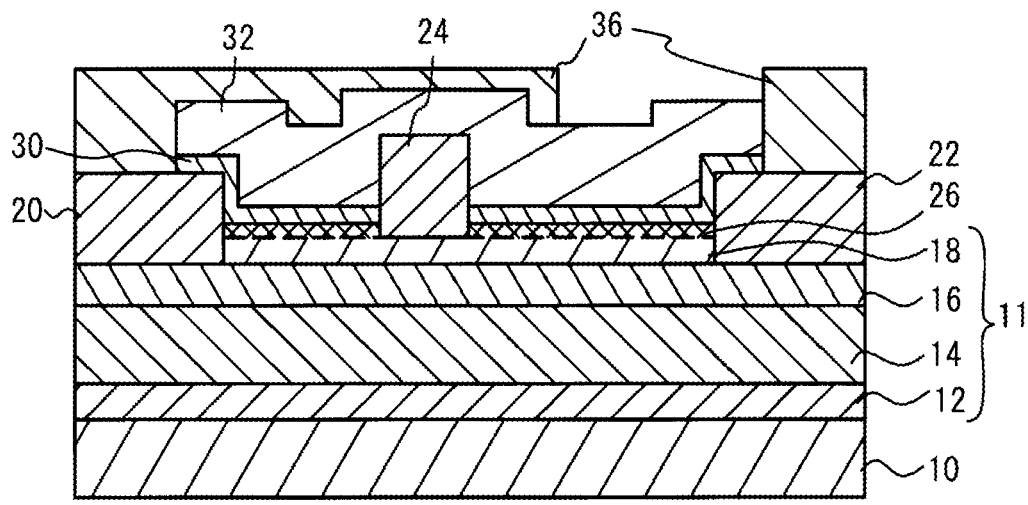
FIG. 3A and FIG. 3B are a cross sectional view for illustrating the method for fabricating the semiconductor device in accordance with the embodiment.
Figure 3B:
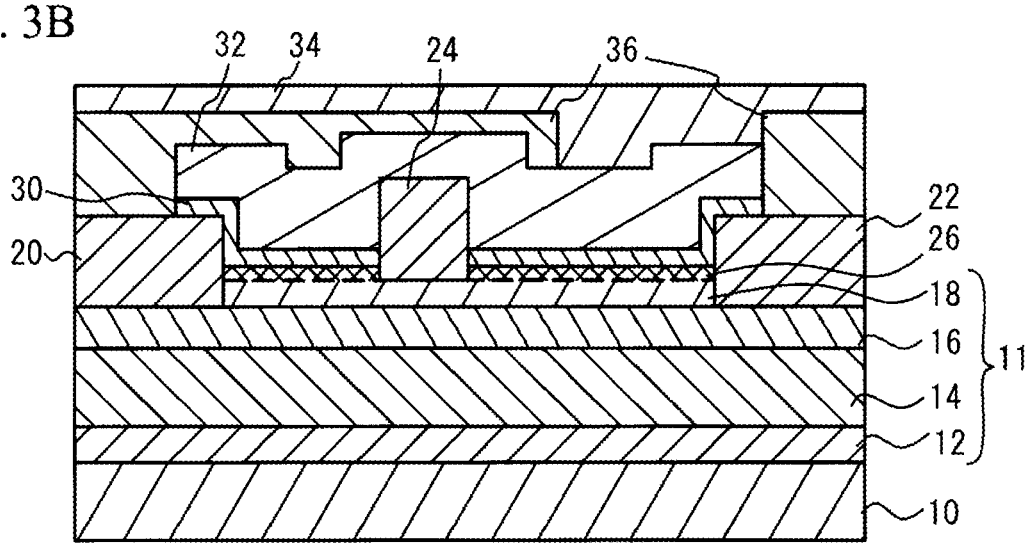

As illustrated in FIG. 3A, openings are formed in the SiN layer 30 and the SiN layer 32. Thus, the source electrode 20 and the drain electrode 22 are exposed. After that, two wirings 36 are formed so as to get in touch with each of the source electrode 20 and the drain electrode 22. The wiring 36 is made of a metal such as Au. As illustrated in FIG. 3B, a SiN layer 34 is formed on the SiN layer 32 and the wiring 36. Thus, the SiN layer 32 and the wiring 36 are passivated. The SiN layers 30, 32 and 34 act as a protective layer having humidity resistance. With the processes, a semiconductor device is fabricated.

A description will be given of an examination for testing an effect of the oxygen plasma treatment. In the examination, XPS (X-ray Photoelectron Spectroscopy) was analyzed and a gate to drain current was measured with respect to a sample (embodiment) subjected to the oxygen plasma treatment and another sample (comparative example) not subjected to the oxygen plasma treatment.

A description will be given of the XPS analyze. In this examination, N/Ga ratio (nitrogen/gallium ratio) was measured with the XPS analyze. Table 1 shows the result.

TABLE 1

|  | COMPARATIVE EXAMPLE | EMBDOIMENT |
|---|---|---|
| N/Ga | 0.82 | 0.48 |

Table 1 indicates that the N/Ga ratio of the comparative example was 0.82. In contrast, the N/Ga ratio of the embodiment was 0.48. The results indicate that the oxygen plasma treatment increased the Ga composition ratio of the cap layer 18.

A description will be given of the measurement result of the source to drain current. In this examination, a wafer of 3 inches was used. And, a gate to drain current Igd was measured in a condition that Vgd is applied between the gate electrode 24 and the drain electrode 22. The gate to drain current Igd was measured at five measuring points "up", "low", "left", "right", and "center" with a facet of the wafer facing downward. The measuring points "up", "low", "left" and "right" had a distance of approximately 10 mm from a circumference of the wafer.

Figure 4A:
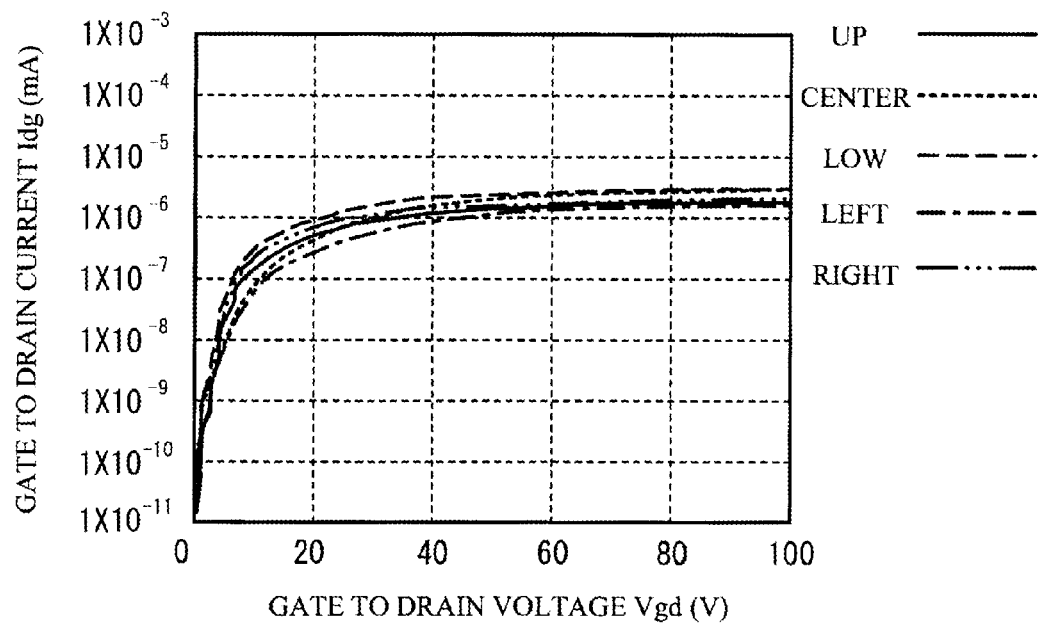
FIG. 4A and FIG. 4B illustrate a result of an experiment.
Figure 4B:
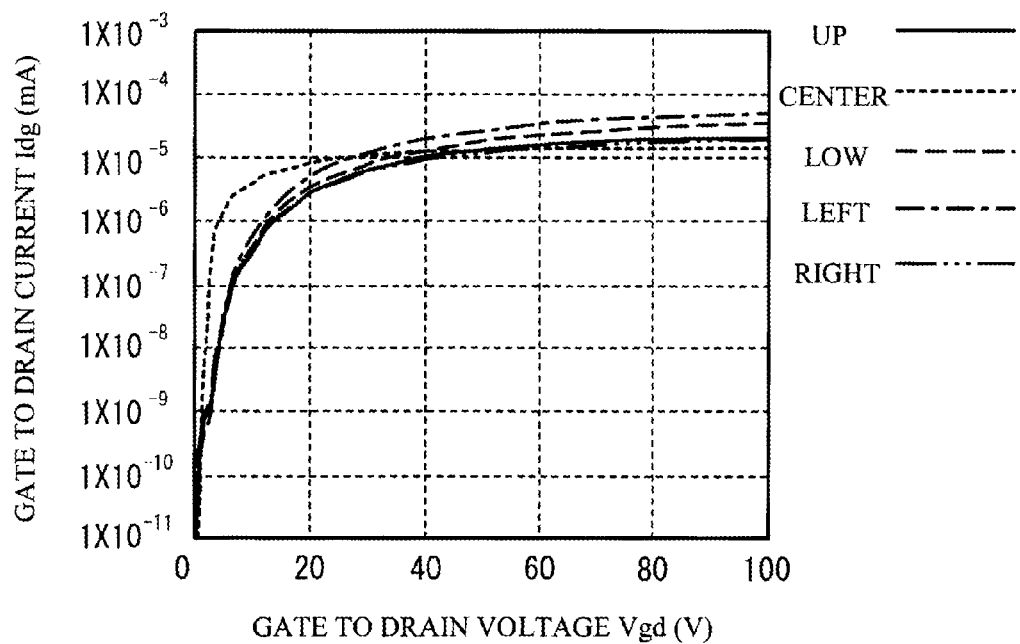

FIG. 4A and FIG. 4B illustrate a result of the examination. FIG. 4A illustrates a result of the comparative example. FIG. 4B illustrates a result of the embodiment. A horizontal axis indicates a gate to drain voltage. A vertical axis indicates a gate to drain current. A solid line indicates a result of "up". A dotted line indicates a result of "center". A broken line indicates a result of "low". A chain line indicates a result of "left". A three-dot chain line indicates a result of "right".

As illustrated in FIG. 4A, Igd was a few μA with respect to the comparative example without the oxygen plasma treatment, even if Vgd was increased. In contrast, as illustrated in FIG. 4B, Igd was a few tens of μA with respect to the embodiment subjected to the oxygen plasma treatment. For example, in the comparative example, the measurement results of the measurement points were approximately 1 μA, when Vgd was 40 V. In the embodiment, the measurement results of the measurement points were approximately 10 μA, when Vgd was 40 V. That is, when the oxygen plasma treatment was performed, Igd became 10 times than the case without the oxygen plasma treatment.

An amount of Au ion moving between electrodes is reduced when a current flows in the conductive layer 26. Thus, ion migration phenomenon may be suppressed. Alternatively, the conductive layer 26 generates heat when a current flows in the conductive layer 26. Water getting into the semiconductor device may be vaporized by the heat of the conductive layer 26. In this case, it is thought that dissolving of Au is suppressed.

In accordance with the embodiment, the ion migration phenomenon may be suppressed because the conductive layer 26 is formed on the cap layer 18. That is, the humidity resistance of the semiconductor device is improved, and thereby the reliability of the semiconductor device is improved. And, the humidity resistance of the semiconductor device is further improved because the conductive layer 26 is formed with the oxygen plasma treatment. Therefore, the structure and the fabrication processes of the semiconductor device may be simplified.

The power density of the oxygen plasma treatment may be determined so that the conductive layer 26 having higher Ga composition ratio can be formed. However, the power is excessively large, the nitride semiconductor layer 11 may be damaged significantly. It is therefore preferable that the power density is 0.2 to 0.3 W/cm². However, the power density may be larger than 0.2 W/cm² and less than 0.3 W/cm². The power density may be 0.22 to 0.28 W/cm². As mentioned above, the conductive layer 26 having higher Ga composition ratio is formed by removing N included in the cap layer 18 through the oxygen plasma treatment. A favorable conductive layer may not be formed if a reaction gas other than oxygen is provided in the oxygen plasma treatment. It is therefore preferable that only oxygen gas is provided in the oxygen plasma treatment in order to form a favorable conductive layer.

The nitride semiconductor layer 11 may be another nitride semiconductor. The nitride semiconductor is a semiconductor including nitrogen. For example, InN (indium nitride), InGaN (indium gallium nitride), InAlN (indium aluminum nitride), AlInGaN (aluminum indium gallium nitride) or the like may be used as the nitride semiconductor layer 11. That is, the nitride semiconductor layer 11 may be made of a nitride semiconductor layer other than n-GaN. However, it is preferable that the nitride semiconductor layer 11 is made of a nitride semiconductor including Ga in order to form the conductive layer 26 favorably. And it is preferable that the nitride semiconductor layer 11 is made of GaN or AlGaN.

The current flowing in the conductive layer 26 is smaller than the drain current during the operation of the semiconductor device by a few digits. Therefore, fluctuation of the characteristics of the semiconductor device caused by the current flowing in the conductive layer 26 is extremely small. It is therefore possible to suppress the degradation of the characteristics of the semiconductor device and improve the humidity resistance of the semiconductor device.

The present invention is not limited to the specifically disclosed embodiments and variations but may include other embodiments and variations without departing from the scope of the present invention.

What is claimed is:

1. A method for fabricating a semiconductor device comprising
    performing oxygen plasma treatment to a surface of a nitride semiconductor layer, a power density of the oxygen plasma treatment being 0.2 to 0.3 W/cm$^2$, wherein a conductive layer is formed on a surface of the nitride semiconductor layer by the oxygen plasma treatment,
    forming a silicon nitride layer on the nitride semiconductor layer,
    forming an opening in the silicon nitride layer so that a part of the surface of the nitride semiconductor layer is exposed through the opening,
    forming a gate electrode on an exposed surface of the semiconductor layer.

2. The method as claimed in claim 1, wherein the oxygen plasma treatment is carried out by introducing a reaction gas of oxygen only.

3. The method as claimed in claim 1, wherein the nitride semiconductor layer includes gallium.

4. The method as claimed in claim 2, wherein the nitride semiconductor layer includes gallium.

5. The method as claimed in claim 1, wherein the nitride semiconductor layer is one of gallium nitride, aluminum gallium nitride, aluminum nitride, indium nitride, indium aluminum nitride, and aluminum indium gallium nitride.

6. The method as claimed in claim 2, wherein the nitride semiconductor layer is one of gallium nitride, aluminum gallium nitride, aluminum nitride, indium nitride, indium aluminum nitride, and aluminum indium gallium nitride.

7. The method as claimed in claim 1, further comprising
    forming an insulation layer in contact with the surface of the nitride semiconductor layer, after the oxygen plasma treatment is performed.

8. The method as claimed in claim 7, wherein the insulation layer comprises silicon nitride.

9. The method as claimed in claim 1, wherein the power density of the oxygen plasma treatment is 0.22 to 0.28 W/cm$^2$.

10. The method as claimed in claim 1, wherein the nitride semiconductor layer is contacted with an electrode.

11. The method as claimed in claim 10, wherein the electrode includes at least one of Au, Ni, and W.

12. The method as claimed in claim 11, wherein the electrode is a source or drain electrode of a FET.

13. The method as claimed in claim 11, wherein the nitride semiconductor layer is formed on a stacked structure of a channel layer and an electron supply layer on a substrate.

* * * * *